United States Patent [19]

Ebinuma et al.

[11] Patent Number: 5,623,529
[45] Date of Patent: Apr. 22, 1997

[54] SOR EXPOSURE SYSTEM AND MASK MANUFACTURED THEREBY

[75] Inventors: Ryuichi Ebinuma, Machida; Yutaka Watanabe, Isehara, both of Japan

[73] Assignee: Canon Kabushiki Kaisha, Tokyo, Japan

[21] Appl. No.: 702,862

[22] Filed: Aug. 26, 1996

Related U.S. Application Data

[63] Continuation of Ser. No. 237,052, May 3, 1994, abandoned.

[30] Foreign Application Priority Data

| Jun. 30, 1993 | [JP] | Japan | 5-161954 |
| Aug. 23, 1993 | [JP] | Japan | 5-207830 |
| Feb. 22, 1994 | [JP] | Japan | 6-024206 |

[51] Int. Cl.⁶ .................................................. G21K 5/00
[52] U.S. Cl. .................................................. 378/34
[58] Field of Search ........................... 378/34, 35; 430/5

[56] References Cited

U.S. PATENT DOCUMENTS

| 4,788,698 | 11/1988 | Kimura et al. | 378/34 |
| 5,123,036 | 6/1992 | Uno et al. | 378/34 |
| 5,125,014 | 6/1992 | Watanabe et al. | 378/34 |
| 5,128,975 | 7/1992 | Iwamoto et al. | 378/34 |
| 5,150,151 | 9/1992 | Mochizuki et al. | 355/53 |
| 5,168,512 | 12/1992 | Iwamoto et al. | 378/34 |
| 5,172,402 | 12/1992 | Mizusawa et al. | 378/34 |

FOREIGN PATENT DOCUMENTS

5-114548  5/1993  Japan .

OTHER PUBLICATIONS

"X-ray replication of masks using the synchrotron radiation produced by the ACO storage ring"; Sep. 15, 1976; pp. 370–372.

*Primary Examiner*—Don Wong
*Attorney, Agent, or Firm*—Fitzpatrick, Cella, Harper & Scinto

[57] ABSTRACT

In an X-ray lithographic system comprising a plurality of X-ray exposure apparatus which use an SOR radiation source apparatus as a common illumination light source, an exposure apparatus usable for duplicating an X-ray mask is connected to at least one beam line. The beam line is longer than the other wafer exposure beam lines so that the divergence angle is small (i.e., the resolving power for exposure transfer is higher). Thus, the X-ray mask can precisely be manufactured at low cost.

14 Claims, 14 Drawing Sheets

FIG. I

SOR EXPOSURE SYSTEM AND MASK MANUFACTURED THEREBY

This application is a continuation of application Ser. No. 08/237,052, filed May 3, 1994, now abandoned.

BACKGROUND OF THE INVENTION

1. Field of the Invention

The present invention relates to an exposure apparatus which uses synchrotron radiation for, for example, manufacturing devices.

2. Description of the Related Art

An X-ray exposure apparatus has been proposed in which a mask pattern is transferred onto a wafer in close proximity thereto by exposure using X-rays as illumination light in the manufacture of semiconductor integrated circuits having a high degree of integration.

In the manufacture of semiconductor integrated circuits, the exposure process is performed in a plurality of lines in order to increase the productivity, and a plurality of the same X-ray masks are prepared. The pattern to be formed on a mask is generally formed by a method of drawing by an electron beam drawing apparatus. However, the time required for drawing a circuit pattern having a degree of integration on a 256 Mbit-DRAM scale is several minutes, and sometimes reaches several hours, and much time is thus required for forming a plurality of masks.

On the other hand, there is known a method of duplicating an original pattern by proximity X-ray exposure, or life-size exposure, using an original mask formed by the electron beam drawing apparatus to form a plurality of X-ray masks. The X-ray exposure apparatus can employ a wide exposure region, and exhibits a shorter time required for exposure than that in electron beam drawing. Thus, this method can significantly improve the productivity of masks.

In order to absorb X-rays, an absorber pattern made of gold or the like and having a thickness of about 0.7 μm is formed on the X-ray mask by plating or etching. Although the electron beam drawing method uses a multi-layer photosensitive material for obtaining a thick absorber layer, the proximity X-ray exposure method can expose a photosensitive material having a sufficient thickness because a resolvable depth is large, and can employ the exposure process using a single layer of photosensitive material. The X-ray exposure method can therefore sometimes form X-ray masks at a cost lower than that in the electron beam drawing method.

Considering the above advantageous conditions, attention is paid to the method of forming X-ray masks for wafer exposure by using the X-ray exposure apparatus.

SUMMARY OF THE INVENTION

In proximity exposure, the parallelism of illumination light significantly affects the distortion caused in transfer. Namely, the illumination light is applied to portions of an exposure region at different incident angles unless the illumination light is not completely parallel, and a deviation between a mask image and a transferred image is represented by a value obtained by multiplying the incident angle by a gap dimension between a mask and a substance to be exposed. If the gap dimension is not constant, therefore, a deviation between the mask image and the transferred image is not constant.

In the X-ray exposure apparatus which uses a synchrotron radiation source as an illumination light source, for example, when the mask is disposed at a distance of about 10 m from the light source in order to ensure an exposure region of about 30 mm, illumination light having a divergence angle of 3 mrad can be obtained. In this case, if the setting precision of the gap is, for example, 3 μm, a deviation of 9 nm occurs between the mask image and the transferred image. When the wafer is exposed, for example, since the superposition precision required for exposure with a resolution of 0.2 μm is about 50 nm, a deviation of 9 nm between images is permissible. However, the precision is a problem when a mask is duplicated.

Although the sensitivity of a photosensitive material to X-rays is several tens of mJ/c, the illumination light in an amount of about 2 times the sensitivity of the photosensitive material is applied to the masks in view of the energy of illumination light absorbed by a mask substrate. Most of the illumination light absorbed by the mask is converted into thermal energy and transmitted to the wafer through gases present between the mask and the wafer. The thermal energy transmitted from the mask to the wafer and the thermal energy generated by the illumination light absorbed by the photosensitive material and the wafer are dissipated to a wafer chuck which adheres to the wafer. However, with a low heat transfer rate of such a heat transfer passage or a high intensity of illumination light, thermal distortion occurs due to a temperature rise of the wafer and the mask during exposure, thereby causing deterioration in resolving power. In the X-ray exposure apparatus, therefore, means such as cooling means or the like is provided on the wafer chuck, and the intensity of the illumination light is increased within a permissible range of resolving power so that the productivity is increased.

When a mask is duplicated by using such an X-ray exposure apparatus, there are not only the demand for resolving power higher than that for exposure of the wafer but also structural conditions more disadvantageous than those in exposure of the wafer. A mask substrate to be exposed has a portion which is previously back-etched for forming a pattern therein. Since this portion of the substrate generally has a thickness of about 1 to 2 μm, the back of the portion is difficult to adhere directly to the chuck. The heat transfer rate of the heat transfer passage to the chuck is thus lower than that in exposure of the wafer. This increases the thermal distortion with the same intensity of the illumination light, and makes it difficult to obtain higher resolving power than that for exposure of the wafer.

It is an object of the present invention to solve the above problems, an object which is achieved by providing an SOR exposure system and exposure apparatus which are suitable for duplicating X-ray masks and which enable formation of masks with high precision and at low cost.

In accordance with a preferred embodiment of the present invention, an SOR exposure system comprises a plurality of X-ray exposure apparatus connected to beam lines extended from a common SOR light source, wherein an exposure apparatus which can be used for duplicating masks is connected to at least one beam line.

In accordance with another preferred embodiment of the present invention, a duplicate mask duplicated by transferring a pattern by proximity exposure using an original mask has a pattern having a higher aspect ratio than that of the original mask.

In accordance with a further preferred embodiment of the present invention, an exposure apparatus for manufacturing duplicate masks comprises a lock mechanism for connecting first holding means for an original mask and second holding means for a duplicate mask substrate so as to prevent relative movement between the original mask and the duplicate mask substrate during exposure transfer.

Other objects and embodiments of the present invention will be made clear in the description of the preferred embodiments below.

DESCRIPTION OF THE PREFERRED EMBODIMENTS

Embodiments of the present invention are described below with reference to the drawings.
Embodiment 1

Figure 1:
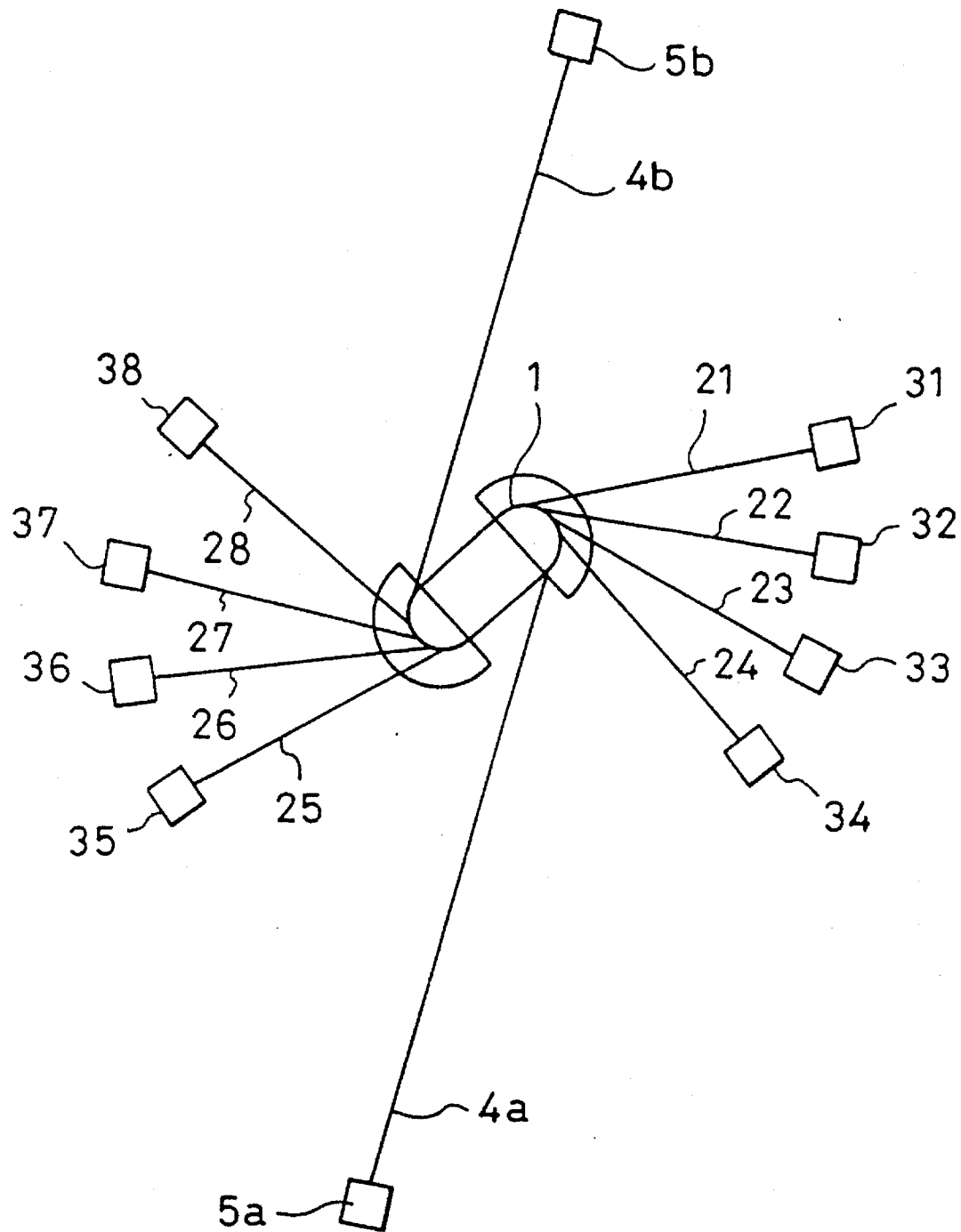
FIG. 1 is a drawing illustrating a synchrotron X-ray exposure system in accordance with a first preferred embodiment of the present invention.

FIG. 1 shows the construction of an SOR exposure system in accordance with a first preferred embodiment of the present invention. In FIG. 1, reference numeral 1 denotes an SOR light source apparatus including a charge storage ring, the synchrotron radiation emitted from the charge storage ring 1 being supplied to beam lines 21 to 28 connected to exposure apparatus 31 to 38 for exposing wafers, and beam lines 4a and 4b connected to exposure apparatus 5a and 5b, respectively, for duplicating X-ray masks. In this embodiment, the mask duplicating beam lines 4a and 4b are longer than the beam lines 21 to 28 and have a smaller divergence angle (i.e., higher resolving power for exposure transfer).

Figure 2:
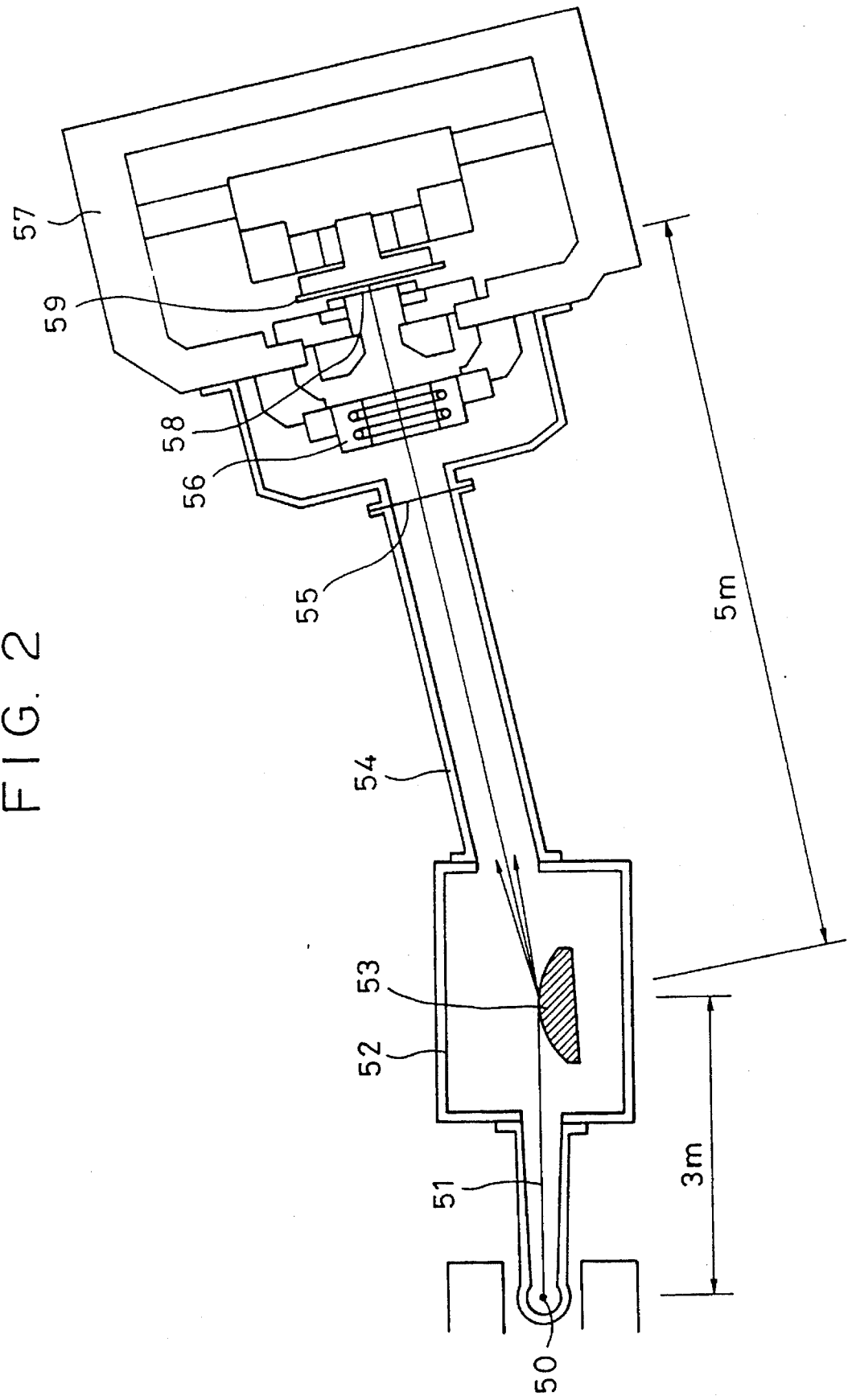
FIG. 2 is a drawing illustrating a construction of a beam line and an exposure apparatus for exposing a wafer.

FIG. 2 illustrates the construction of the beam lines 21 to 28 to which the wafer exposure apparatus 31 to 38 are respectively connected, the beam lines 21 to 28 having the same construction. The synchrotron radiation 51 emitted from an emission point 50 is enlarged and vertically reflected by a convex X-ray mirror 53 in a mirror chamber 52. The radiation 51 is then passed through a vacuum duct 54, a vacuum partition 55, and a shutter unit 56 and is projected onto a mask 58 to transfer a mask pattern to a wafer 59 by exposure. The inside of an exposure unit 57 containing the mask 58 and the wafer 59 has a He atmosphere under pressure reduced to about 150 torr. The vacuum partition 55 is made of a Be foil having a thickness of about 15 μm so as to decrease the attenuation of the illumination light within the region from the vacuum partition 55 to a photosensitive material on the wafer 59. The above illumination optical system is designed so that the intensity of the illumination light satisfies resolving power and productivity (throughput) which are required for manufacturing wafers.

In this construction, since the distance from the emission point 50 to the X-ray mirror 53 is, for example, 3 m, and the distance from the X-ray mirror 53 to the mask 58 is, for example, 5 m, the distance from the emission point 50 to the mask 58 is 8 m. If the exposure region of the wafer 59 has, for example, a 30-mm square rectangular form, the horizontal divergence angle is 3.75 mrad, and the vertical divergence angle is 6 mrad. If the dispersion of the gap dimension between the mask 58 and the wafer 59 is 3 μm, a distortion of 18 nm occurs in transfer of the pattern. Although the intensity of the illumination light depends upon the intensity of the synchrotron radiation and the sensitivity of the photosensitive material on the wafer used, the illumination optical system is designed so that the intensity of the illumination light satisfies the condition that the exposure time is about 0.3 to 1 second.

Table 1, below, shows details of the design of the illumination system in the wafer exposure apparatus shown in FIG. 2. The X-ray mirror used is made of silicon carbide and is processed so that the reflecting surface has a surface roughness of 1 nm (rms), and the angle of incidence of the main SOR beam on the reflecting surface is 15 mrad. This mirror decreases the intensity of the short wavelength component of the SOR beam. The vacuum partition made of a 15-μm Be foil decreases the intensity of the long wavelength component. The items of this optical system are determined so that an intensity and contrast sufficient for practical use are obtained in the intensity profile of the exposure light absorbed by a chemical sensitization type resist on the wafer when the exposure light is applied to the resist through an X-ray mask comprising a gold absorber pattern having a thickness of 0.6 μm and a silicon nitride membrane having a thickness of 2 μm.

Figure 3:
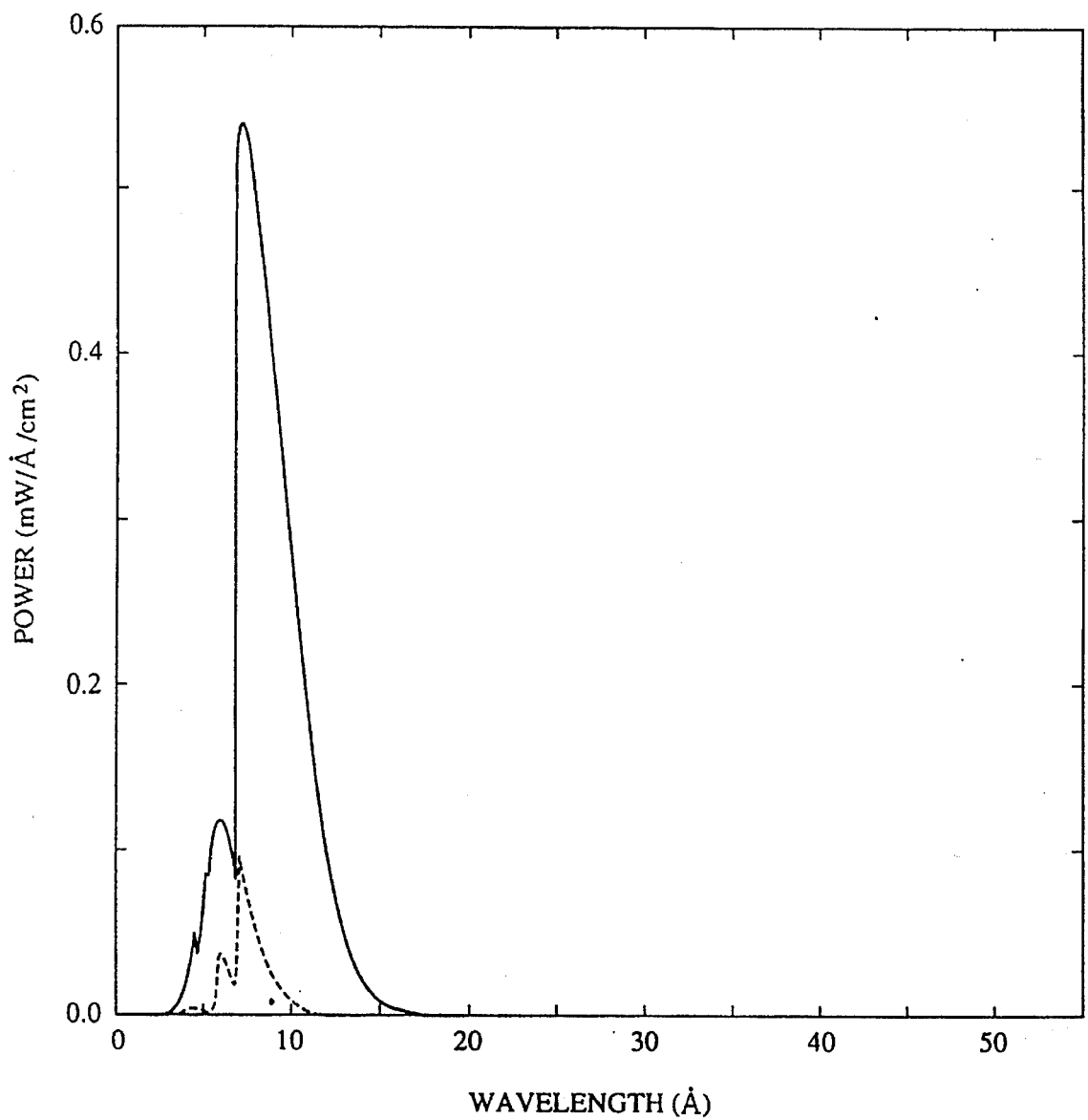
FIG. 3 is a graph illustrating the absorption intensity distribution spectrum of a resist when the apparatus shown in FIG. 2 is used.

FIG. 3 shows the absorption intensity distribution of the resist in the illumination system having the items shown in Table 1. In FIG. 3, a solid line shows the spectrum of the exposure light transmitted by a portion of the mask without the gold absorber pattern, and a dotted line shows the spectrum of the exposure light transmitted by a portion with the gold absorber. The absorption intensity of the exposure light is obtained by integrating each of the spectra shown in FIG. 3 with wavelength. The absorption intensity in the portion without the gold absorber is approximately 2.13 mW/cm$^2$, and the absorption intensity in the portion with the gold absorber is approximately 0.176 mW/cm². If the optimum amount of the light absorbed by the resist required for transfer is 60 J/cm³, since the thickness of the resist is 1 μm, the exposure time is approximately 2.8 seconds. In addition, the contrast between the pattern portion and the non-pattern portion is 12.1:1.

Figure 4:
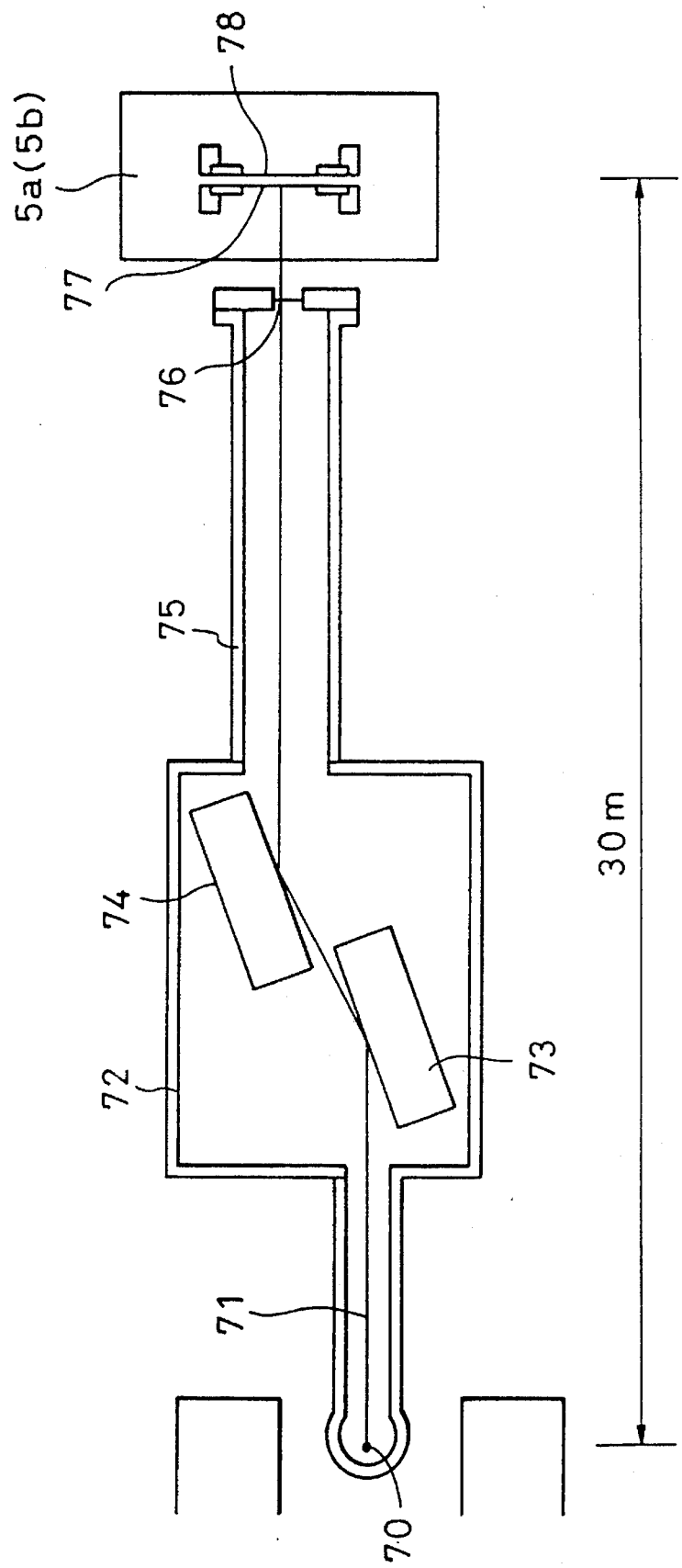
FIG. 4 is a drawing illustrating the construction of a beam line and an exposure apparatus for duplicating an X-ray mask.

FIG. 4 illustrates the construction of the beam line 4a (or 4b) to which the X-ray mask duplicating exposure apparatus 5a (or 5b) is connected. The synchrotron radiation 71 emitted from an emission point 70 is reflected twice by two plane mirrors 73 and 74 in a mirror unit 72. The radiation 71 is then passed through a vacuum duct 75 and a vacuum partition 76 and is projected onto an original mask 77 to transfer by exposure an original mask pattern to a mask substrate 78 to be exposed.

In this apparatus, the distance from the light source to the mask is, for example, 30 m, and the horizontal divergence angle is 1 mrad. The whole exposure region is exposed by scanning the original mask 77 and the mask 78 to be exposed vertically to the illumination light without vertically enlarging by a mirror. In this case, the illumination light is made parallel in the vertical direction. Since the mask substrate which is flatter than the wafer subjected to various processes is used as a substance to be exposed, the dispersion of the gap dimension can be set to a small value. For example, if the dispersion of the gap dimension is 2 μm, the resultant distortion is 2 nm.

Table 2 shows details of a design of the illumination system in the X-ray mask duplicating exposure apparatus shown in FIG. 4. The two X-ray mirrors 73 and 74 are made of silicon carbide and are processed so that the reflecting surface of each has a surface roughness of 4 nm (rms), and the angle of incidence of the main SOR beam on each of the reflecting surfaces is 26 mrad. These mirrors have low reflectance on the short wavelength side and thus have a central wavelength longer than the central wavelength of the exposure light obtained by the wafer exposing beam lines. The vacuum partition 76 is made of a material of polyimide having a thickness of 0.5 μm, and separates the He atmosphere under reduced pressure in the exposure apparatus from the vacuum in each of the beam lines. The polyimide has higher transmittance than Be on the long wavelength side, and can thus transmit the long-wavelength illumination light selected by the X-ray mirror.

Although the illumination system configured as shown in Table 2 exhibits low illumination intensity and long wavelength, as compared with the illumination system shown in Table 1, it is possible to supply illumination light more suitable for the mask duplicating exposure apparatus for the reasons below. A first reason is that since the illumination intensity is low, the amount of the heat generated due to exposure energy in the original mask and the duplicate mask substrate used as the substrate to be exposed can be decreased, thereby decreasing thermal distortion and increasing the precision of the pattern transfer position. This is particularly effective for the case where the substrate to be exposed for the duplicate mask comprises a thin film. A second reason is that although a long wavelength causes deterioration in the resolving power due to the effect of the light diffracted by the mask, this can be compensated for by decreasing the proximity gap because the duplicate mask substrate as the substrate to be exposed has higher flatness than that of the wafer which was subjected to various processes. In addition, with a long wavelength, since the range of the secondary electrons generated by the X-ray used as the exposure beam is short, the resolving power is increased. For these reasons, high resolving power can be obtained by setting the proximity gap to a small value.

The absorber pattern of the original mask is produced by drawing the pattern on the resist using an electron beam drawing exposure apparatus, and then etching or plating. When the thickness of the finally formed absorber is as small as possible, the stress strain generated can be decreased. The thickness distribution of the absorber can also be decreased, and the precision of the pattern line width transferred can be improved. Further, when the pattern is produced by the plating method, if the absorber has a thickness of, for example, about 0.2 μm, a single-layer resist can be used in electron beam drawing. When the pattern is produced by etching, the process can be simplified. In this way, in manufacturing the original mask, the mask with higher precision can easily be manufactured by decreasing the thickness of the absorber pattern.

The items of the illumination system shown in Table 2 are determined so as to select exposure light having a wavelength which can achieve a satisfactory contrast even if the gold absorber of the original mask has a thickness of 0.2 μm. If the line width dimension of the pattern is 0.2 μm, the ratio of the line width to the thickness, i.e., the aspect ratio, is 1. A low aspect ratio is also advantageous for manufacturing the original mask. The X-ray mask with a higher aspect ratio can be duplicated by using the original mask.

Figure 5:
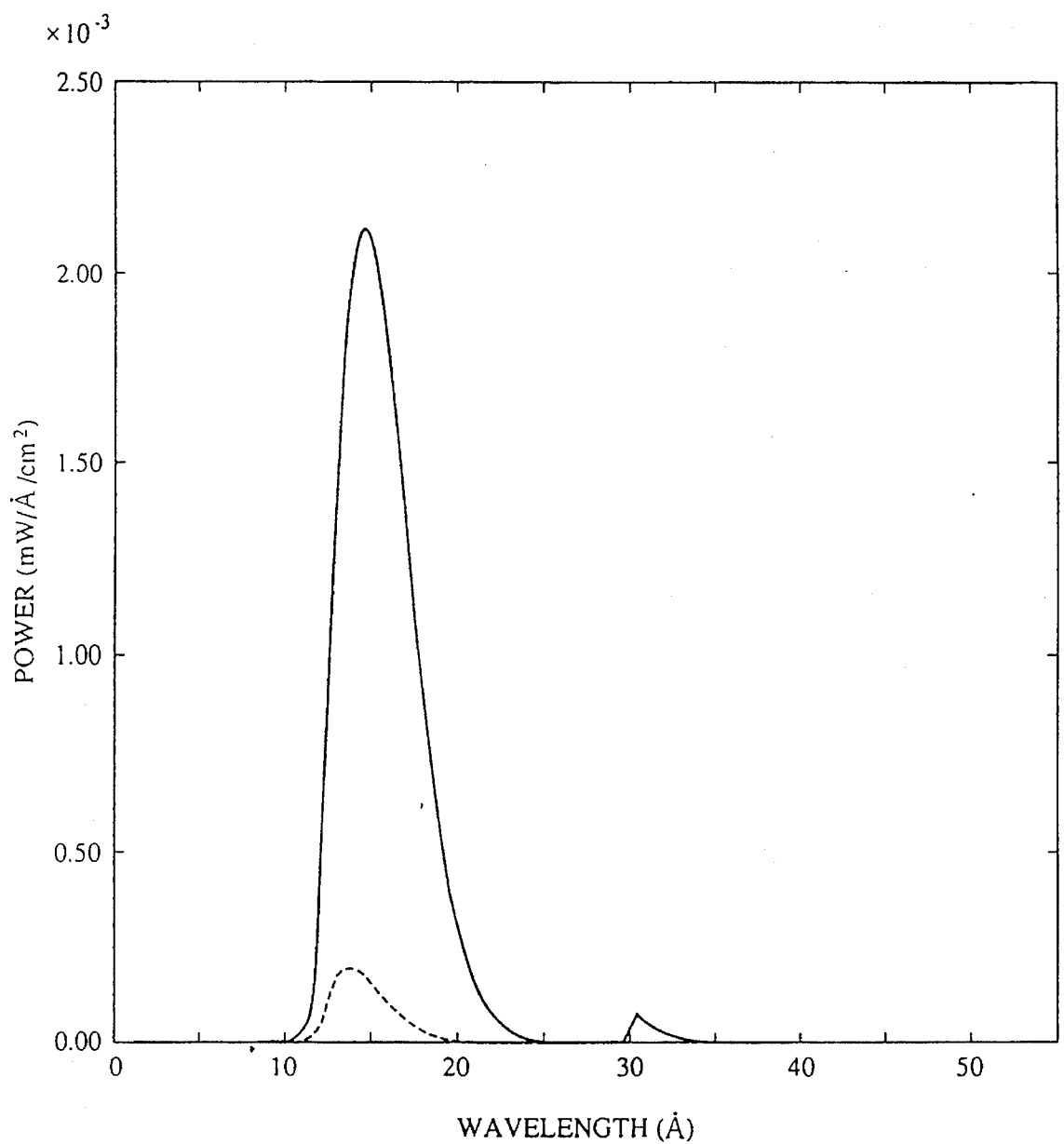
FIG. 5 is a graph illustrating the absorption intensity distribution spectrum of a resist when the apparatus shown in FIG. 4 is used.

FIG. 5 shows the absorption intensity distribution of the resist in the illumination system having the items shown in Table 2. In FIG. 5, a solid line shows the spectrum of the exposure light transmitted by a portion of the mask without the gold absorber pattern, and a dotted line shows the spectrum of the exposure light transmitted by a portion with the gold absorber. The comparison with FIG. 3 reveals that the central wavelength of the spectra is longer than that shown in FIG. 3. The design having the items shown in Table 2 thus enables the achievement of illumination light having a longer wavelength. The value of absorption intensity of the exposure light is determined by integrating each of the spectra shown in FIG. 5 with wavelength. The absorption intensity in the portion without the gold absorber is approximately 0.0113 mW/cm², and the absorption intensity in the portion with the gold absorber is approximately 0.000818 mW/cm². The contrast between the pattern portion and the non-pattern portion is thus 13.8:1.

Figure 6:
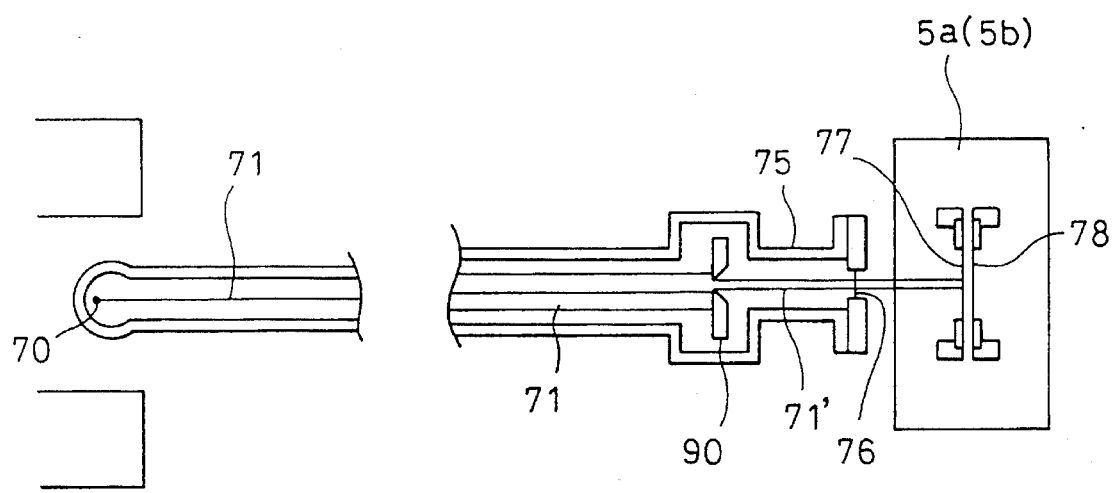
FIG. 6 is a drawing illustrating a construction of an X-ray mask duplicating beam line without a plane mirror for selecting a wavelength.

The light having a short wavelength contained in the synchrotron radiation scatters the secondary electrons emitted from the mask substrate used as the material to be exposed and sensitizes the photosensitive material, thereby deteriorating the resolving power in duplication of the mask. The embodiment shown in FIG. 4 thus uses plane mirrors 73 and 74 for removing the adverse short-wavelength component. However, a construction without such reflecting mirrors is, in some cases, effective from the viewpoint of the characteristics of the synchrotron radiation. In this case, the construction of a mask duplicating beam line is as shown in FIG. 6. The beam line shown in FIG. 6 does not have the mirror unit containing the plane mirrors shown in FIG. 4. In FIG. 6, reference numeral 90 denotes a shielding member which has a slit-formed opening for passing as a light flux 71' a portion of the upper half of the synchrotron radiation in the vertical divergence therethrough. The shielding member 90 is made of a metal having a thickness sufficient to shield X-rays and has an edge portion in a form which is designed so that the surface area parallel with the beam is decreased for decreasing scattering of the illumination light. In this way, the central portion having the short-wavelength component of relatively high intensity is removed, and the portion having a small amount of short-wavelength component is used as the illumination light.

Figure 7:
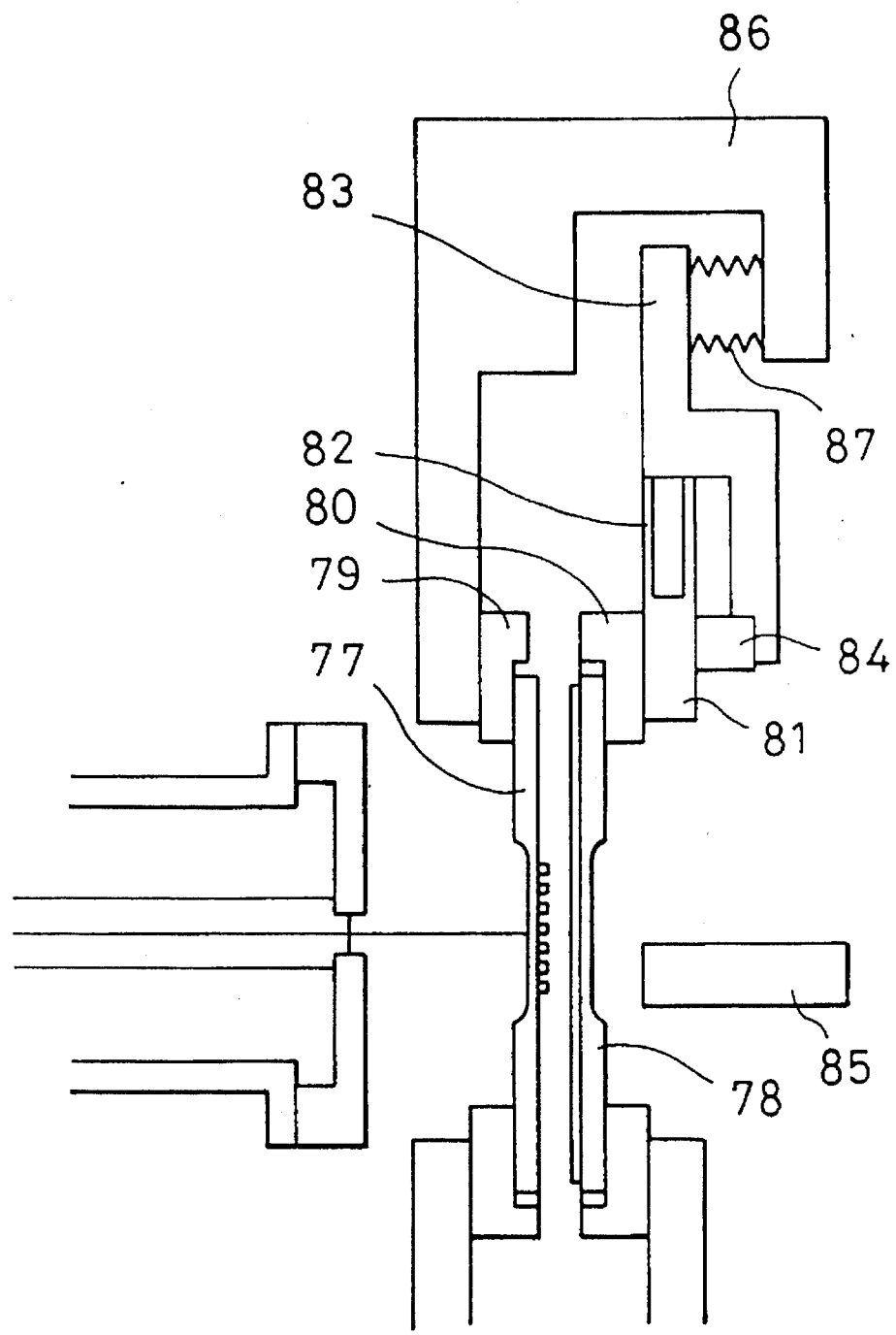
FIG. 7 is a drawing illustrating the construction of an exposure apparatus for duplicating an X-ray mask.

FIG. 7 is a drawing illustrating details of the construction of the X-ray mask duplicating exposure apparatus 5a (or 5b). A mask substrate 78 to be exposed has a frame 80 for supporting the substrate, the frame 80 being held by a vacuum chuck 81. The vacuum chuck 81 is connected to a holding member 83 by a plate spring mechanism 82. A gap setting driving mechanism 84 is provided at three positions in order to move the vacuum chuck 81 in parallel with the plate spring mechanism 82 along the optical axis of the illumination light. The driving amounts of the gap setting driving mechanism 84 are set to different values so that the inclination of the vacuum chuck 81 can be adjusted together with movement of the vacuum chuck 81 along the optical axis. The gap between the original mask substrate 77 and the mask substrate 78 to be exposed can be controlled with high precision by using the detected value of a gap detector 85.

The original mask substrate 77 is attached to a vacuum chuck 79 which is connected to a frame 86. A locking actuator 87 is provided between the frame 86 and the holding member 83 so that the frame 86 and the holding member 83 are connected together with high stiffness by driving the actuator 87 during exposure transfer. The original mask substrate 77 and the mask substrate 78 to be exposed are thus substantially integrated, and are scanned over the whole exposure region at right angles to the illumination light. Since the original mask substrate 77 and the mask substrate 78 to be exposed are mechanically locked in scanning exposure, the relative positional deviation between both substrates, which is caused by vibration or the like during scanning, can be decreased, thereby providing an X-ray mask with higher precision.

Embodiment 2

Figure 8:
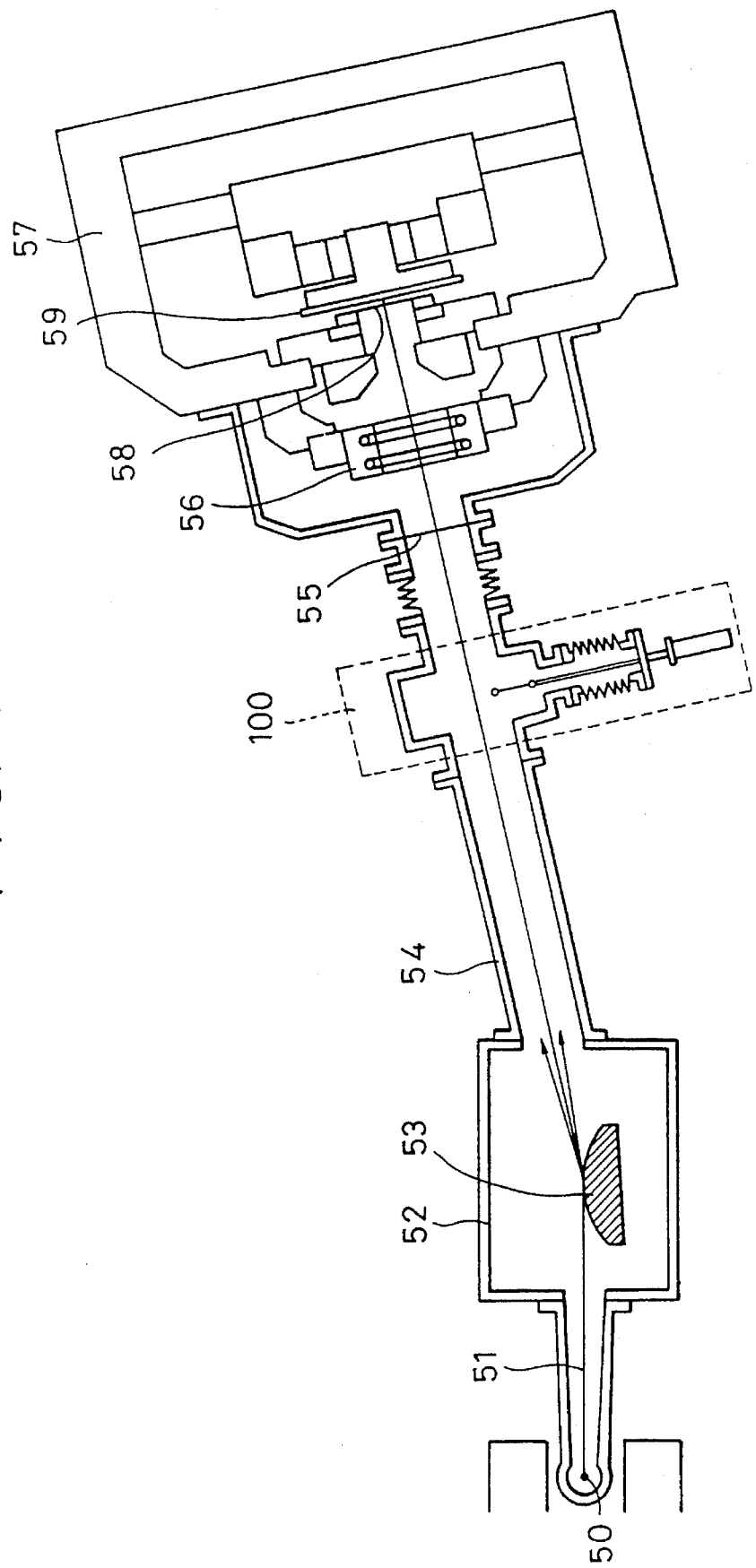
FIG. 8 is a drawing illustrating a construction of a beam line and an exposure apparatus in accordance with a second embodiment of the present invention.

FIG. 8 is a drawing illustrating the construction of a second preferred embodiment of the present invention. The same members as those shown in FIG. 2 are denoted by the same reference numerals. The apparatus of this embodiment is configured so as to be used for both producing semiconductor devices and duplicating masks.

The construction of the system comprises a plurality of exposure apparatus radially connected to a common SOR light source apparatus, as in the construction shown in FIG. 1. An X-ray intensity attenuation means 100 shown in FIG. 8 is provided on any one or all of the beam lines of the exposure apparatus.

Figure 9:
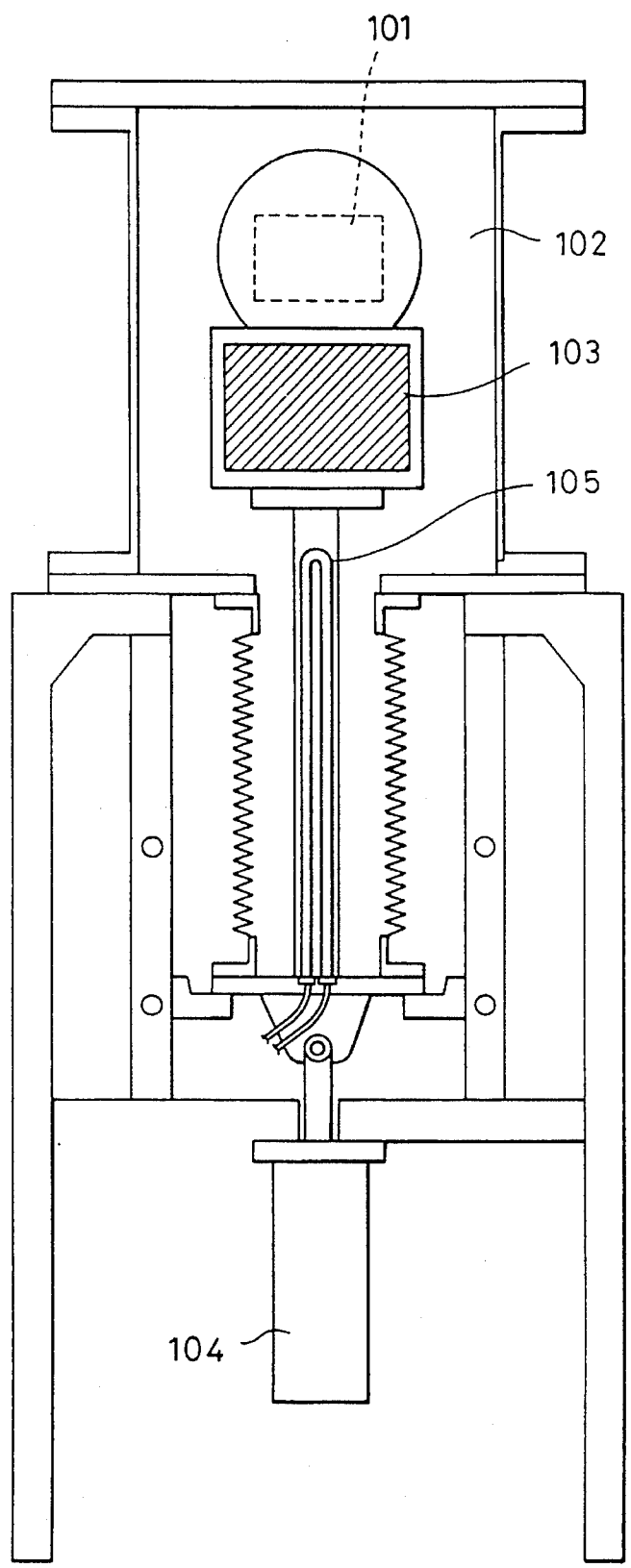
FIG. 9 is a drawing illustrating the detailed construction of intensity attenuation means (in a state where X-rays are not attenuated)
Figure 10:
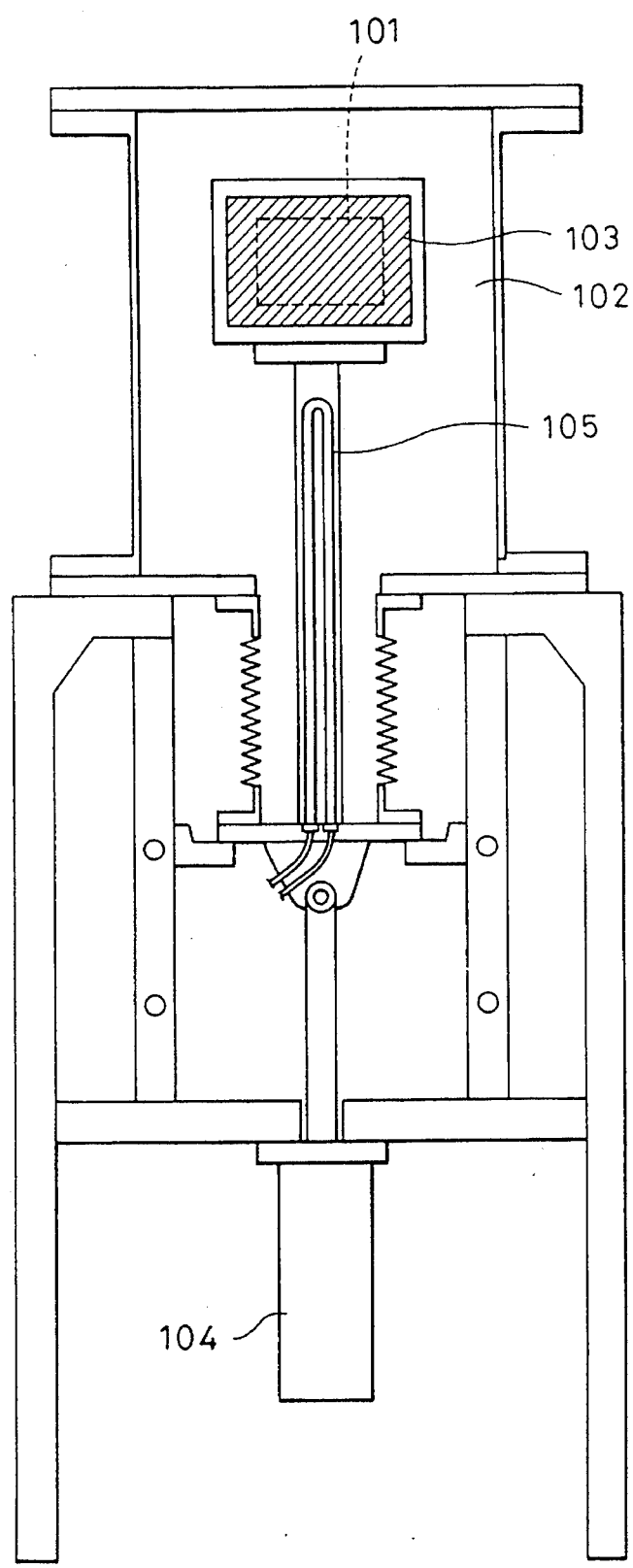
FIG. 10 is a drawing illustrating the detailed construction of intensity attenuation means (in a state where X-rays are attenuated)

FIGS. 9 and 10 are drawings illustrating details of the construction of the intensity attenuation means 100. The inside of a chamber 102 is in a state under the same reduced pressure as in the beam port. When a semiconductor is exposed, i.e., when high X-ray intensity is required for obtaining high productivity, an attenuation filter 103 is retracted from the use region (exposure region) 101 of the illumination light, as shown in FIG. 9, so that the X-rays are introduced into the exposure apparatus without being attenuated. On the other hand, when an X-ray mask is duplicated, i.e., when a high resolving power is required, the attenuation filter 103 is placed on the use region 101 of the illumination light, as shown in FIG. 10, so that the X-rays attenuated in intensity are introduced into the exposure apparatus. The two states are switched by driving a cylinder 104. Since heat is generated in the attenuation filter due to absorption of a portion of X-ray energy in the state shown in FIG. 10, wafer cooling means 105 is provided for preventing the temperature from rising due to the heat generated.

The attenuation filter 103 has a filter comprising a thin plate of silicon, silicon nitride, silicon carbide, beryllium or the like, and a frame member for fixing the filter. The thickness of the filter may be set so that thermal strain is within a desired permissible range in view of the intensity of the illumination light, the heat transfer passage from the original X-ray mask to the chuck, etc.

Figure 11:
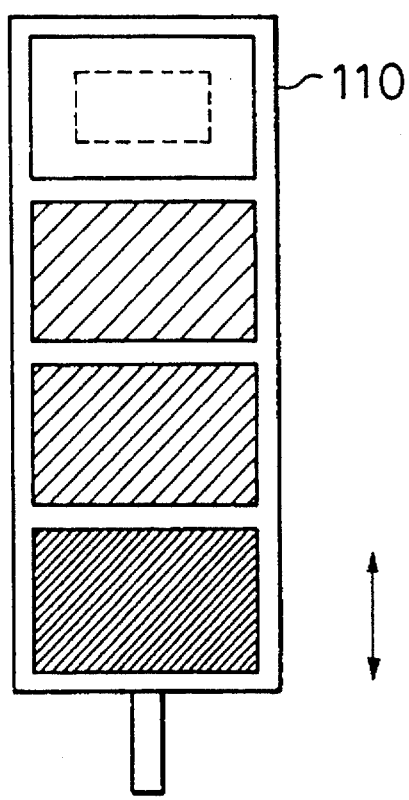
FIG. 11 is a drawing illustrating another example of the intensity attenuation means.

The mechanism for attenuating X-ray intensity is not limited to the above form, and some modified examples can be considered. FIG. 11 is a drawing illustrating another example of the attenuation filter. This example comprises a plurality of filters which have different attenuation factors and which are provided in a frame member 110. The filter selected from the plurality of filters is placed on the use region of the illumination region. The X-ray illumination light having an appropriate intensity can be obtained by switching the filters.

Figure 12:
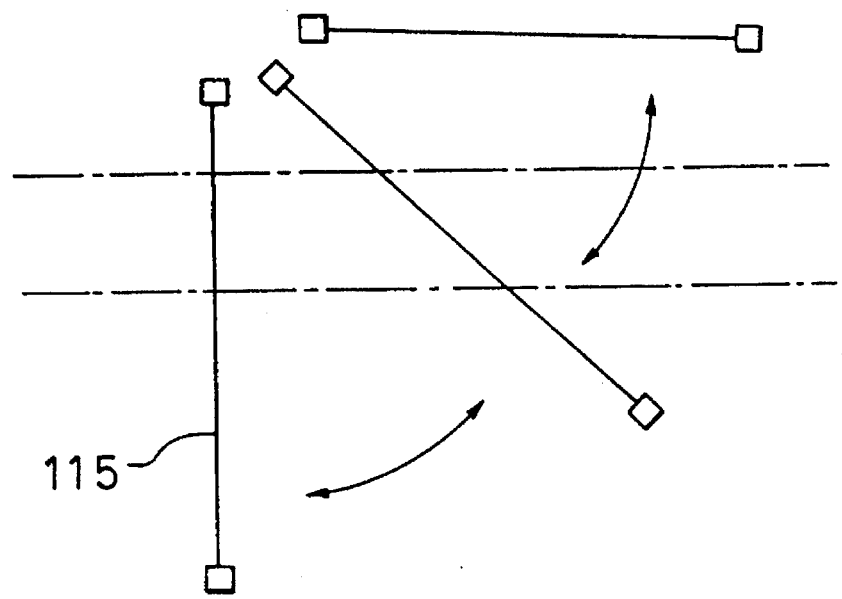
FIG. 12 is a drawing illustrating a further example of the intensity attenuation means.

FIG. 12 is a drawing illustrating a further example of the attenuation filter. A filter 115 having a transmission region with a width greater than the width of the use region of the illumination light is provided on the illumination optical path, and the angle of the filter 115 with respect to the illumination light is adjusted. Since the apparent thickness of the filter 15 can be changed during transmission of the illumination light, the intensity of the illumination light can be arbitrarily attenuated.

Figure 13A:
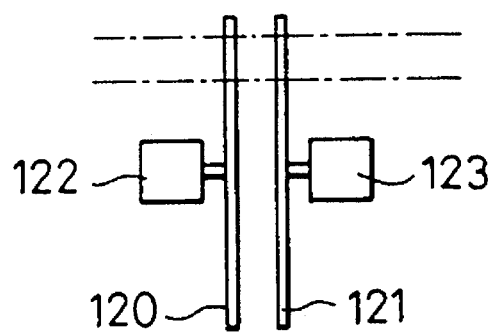
FIGS. 13A and 13B are drawings illustrating a still further example of the intensity attenuation means.
Figure 13B:
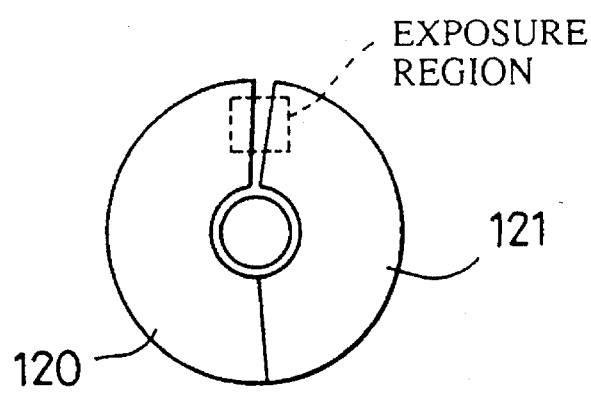

FIGS. 13A and 13B are drawings illustrating a still further example for attenuating the apparent intensity of the illumination light. Two shielding plates 120 and 121 having a substantially semicircular form are provided in the illumination optical path in order to shield the illumination light so as to pass the illumination light through the gap between the two shielding plates. The two shielding plates are simultaneously rotated while maintaining the gap therebetween. If the gap is moved at a speed at which the time required for moving the gap through the exposure region is sufficiently smaller than the time constant of the heat transfer passage from the X-ray mask to the chuck, the substantial intensity of the illumination light applied to the exposure region is attenuated. The attenuation factor can also be adjusted by adjusting the dimension of the gap. In FIG. 13A, the gap is moved by synchronously rotating the two shielding means using motors 122 and 123, respectively, and the gap dimension is adjusted by adjusting the rotational phases of the two motors.

In the above embodiments, since the intensity of the illumination light in an X-ray exposure apparatus which uses the common light source for synchrotron radiation or the like can be adjusted without influences on the illumination light intensity in another exposure apparatus, a high resolving power can be obtained by attenuating the X-ray intensity in duplication of the X-ray mask, and a high productivity can be obtained by increasing the X-ray intensity in wafer exposure. Not only when the X-ray mask is duplicated but also when a device with higher precision is produced, i.e., when high precision exposure is desired in spite of the need for much exposure time, the X-ray intensity may be attenuated, and a semiconductor device with a higher degree of integration can be manufactured.

Embodiment 3

Figure 14:
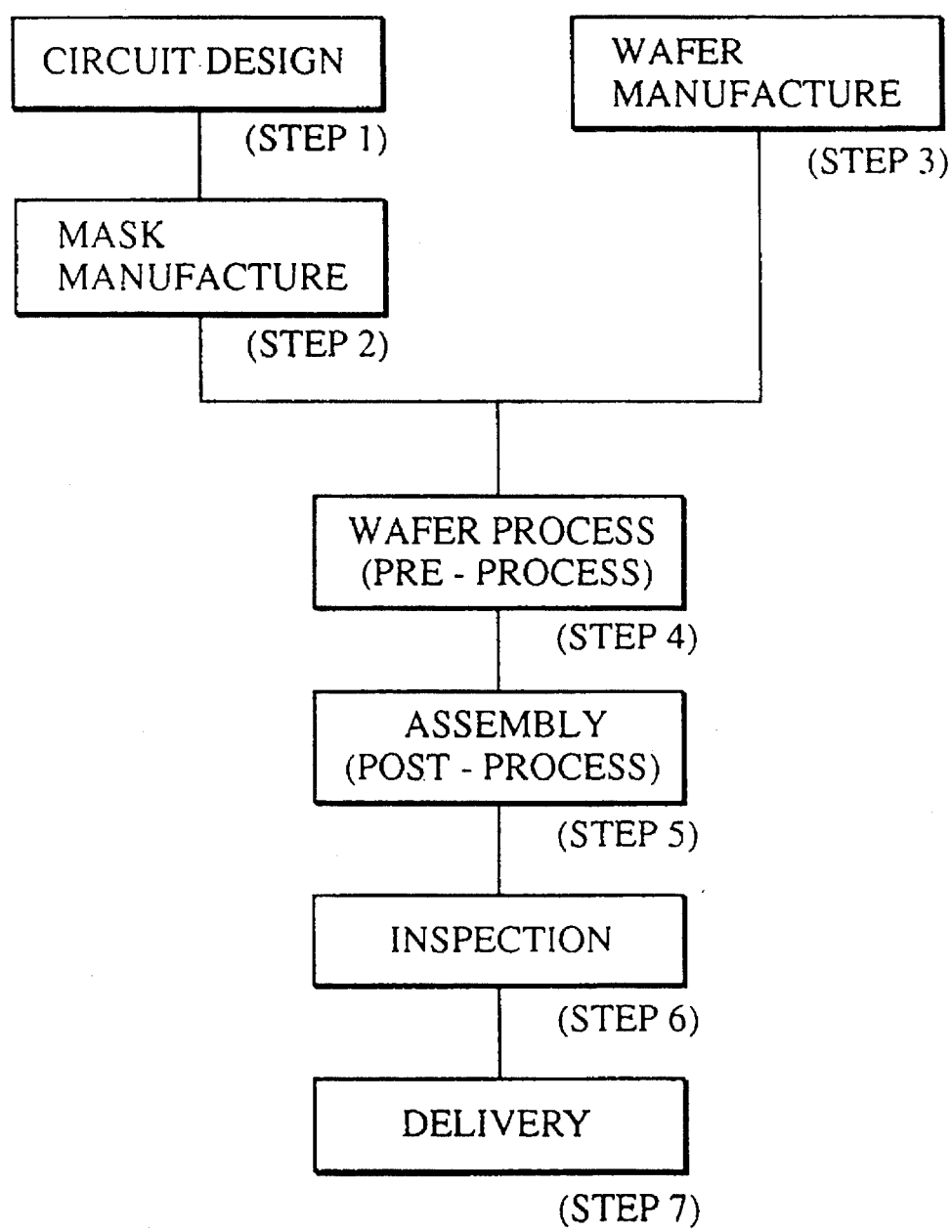
FIG. 14 is a drawing illustrating a device manufacturing flowchart.

An embodiment of the device manufacturing method using the above-described exposure apparatus is described below. FIG. 14 shows a manufacture flowchart of a microdevice (an IC or LSI semiconductor chip, a liquid crystal panel, CCD, a thin-film magnetic head, a micromachine, etc.). The circuit of the device is designed in Step 1 (circuit design). A mask having the designed circuit pattern formed thereon is manufactured in Step 2 (mask manufacture). The manufacture of the mask employs the above-described exposure apparatus. On the other hand, a wafer is manufactured by using material such as silicon or the like in Step 3 (wafer manufacture). Step 4 (wafer process) is referred to as a pre-process for forming an actual circuit on the wafer by the lithographic technique using the prepared mask and wafer. Next Step 5 (assembly) is referred to as a post-process for forming a semiconductor chip using the wafer manufactured in Step 4, the post-process comprising the assembly step (dicing, bonding), the packaging step (chip sealing) and so on. In Step 6 (inspection), tests such as a device operation confirmation test, durability test, etc., are performed on the device manufactured in Step 5. The device is completed through these processes and then delivered (Step 7).

Figure 15:
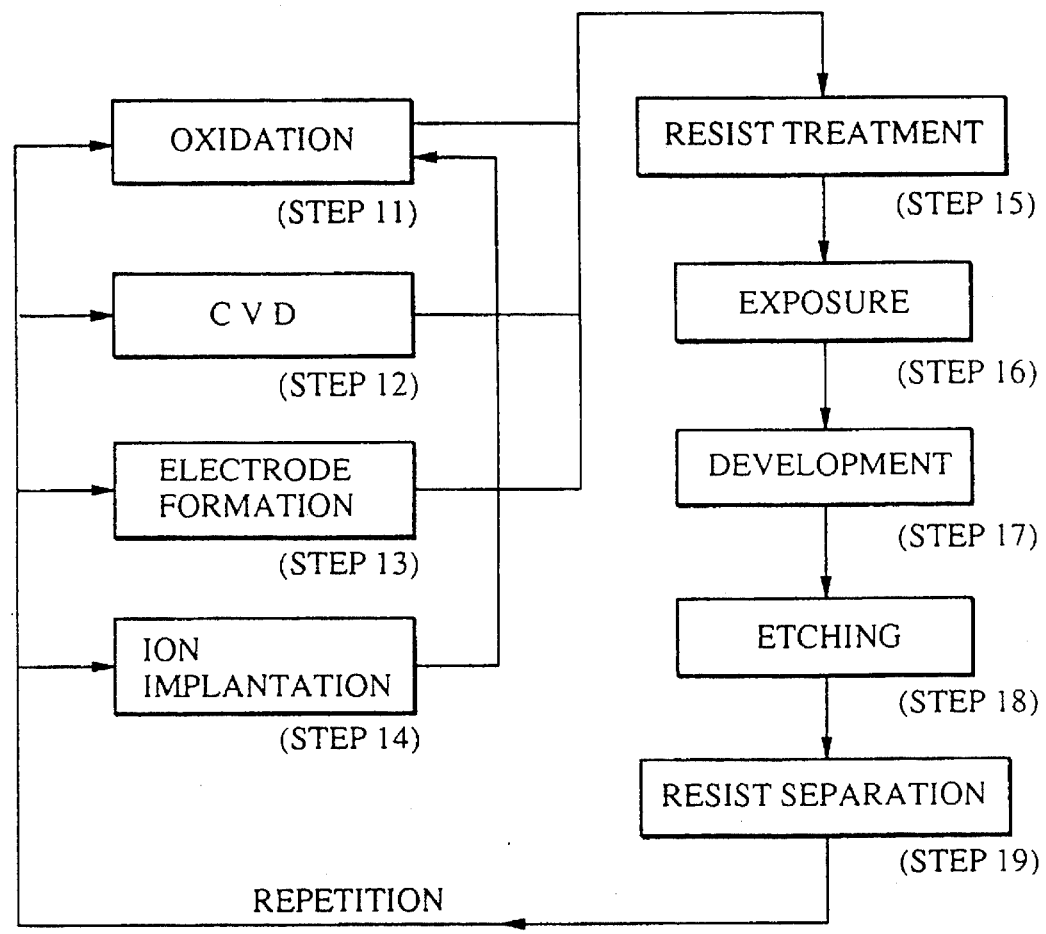
FIG. 15 is a drawing illustrating details of the flowchart of a wafer process.

FIG. 15 shows details of the flowchart of the above wafer process. The surface of the wafer is oxidized in Step 11 (oxidation). An insulating film is formed on the surface of the wafer in Step 12 (CVD). Electrodes are formed on the wafer by evaporation in Step 13 (electrode formation). An ion is implanted into the wafer in Step 14 (ion implantation). A sensitizing agent is coated on the wafer in Step 15 (resist treatment). The circuit pattern of the mask is baked and exposed by the above exposure apparatus in Step 16 (exposure). The exposed wafer is subjected to development in Step 17 (development). Portions other than the developed resist image are cut off in Step 18 (etching). The unnecessary resist after etching is removed in Step 19 (resist separation). These steps are repeated to form a circuit pattern in multiple layers on the wafer. The use of the manufacturing method of this embodiment enables manufacture of a device which cannot be easily manufactured by a conventional method, with a high degree of integration and high productivity.

TABLE 1

Example of Illumination System for Wafer Exposure Apparatus

| | | |
|---|---|---|
| Light source | Electron energy | 700 MeV |
| | Orbital radius | 0.582 m |
| | Stored current | 300 mA |
| | Beam size ($\sigma_y$) | 0.5 mm |
| | Beam divergence angle ($\sigma_{y'}$) | 0.2 mrad |
| | Critical wavelength | 9.49Å |
| Mirror | Reflecting surface material | SiC |
| | Surface roughness | 10 Å |
| | Surface shape | Cylindrical |
| | Radius of curvature | 40 m |
| | Incident angle | 15 mrad |
| X-ray window | Material | Be |
| | Thickness | 15 µm |
| Mask | Supporting film material | $Si_3N_4$ |
| | Thickness | 2 µm |
| Resist | Type | Chemical amplified type |
| | Thickness | 1 µm |
| Arrangement | SOR-mirror | 3 m |
| | SOR-mask | 8 m |
| | X-ray window-mask | 0.4 m |

TABLE 2

Example of Illumination System for Mask Duplicating Exposure Apparatus

| | | |
|---|---|---|
| Light source | Electron energy | 700 MeV |
| | Orbital radius | 0.582 m |
| | Stored current | 300 mA |
| | Beam size ($\sigma_y$) | 0.5 mm |
| | Beam divergence angle ($\sigma_{y'}$) | 0.2 mrad |
| | Critical wavelength | 9.49Å |
| First mirror | Reflecting surface material | SiC |
| | Surface roughness | 40 Å |
| | Surface shape | Plane |
| | Incident angle | 26 mrad |

TABLE 2-continued

Example of Illumination System for Mask Duplicating Exposure Apparatus

| | | |
|---|---|---|
| Second Mirror | Reflecting surface material | SiC |
| | Surface roughness | 40 Å |
| | Surface shape | Plane |
| | Incident angle | 26 mrad |
| X-ray window | Material | polyimide |
| | Thickness | 0.5 µm |
| Mask | Supporting film material | $Si_3N_4$ |
| | Thickness | 2 µm |
| Resist | Type | Chemical amplified type |
| | Thickness | 3 µm |
| Arrangement | SOR-first mirror | 3 m |
| | SOR-second mirror | 4 m |
| | SOR-mask | 30 m |
| | X-ray window-mask | 0.4 m |

What is claimed is:

1. An SOR exposure system, comprising:

a synchrotron radiation source; and a plurality of X-ray exposure apparatuses, connected to said synchrotron radiation source by a plurality of beam lines, for manufacturing semiconductor devices, wherein one of said plurality of exposure apparatuses comprises a duplicating exposure apparatus for duplicating an original mask to form a duplicated mask by exposing the original mask and a substrate disposed proximate to each other with the synchrotron radiation to transfer a pattern of the original mask to the substrate to form the duplicated mask, and wherein a divergence angle of illumination radiation introduced into said duplicating exposure apparatus for duplicating the original mask is less than that introduced into the other exposure apparatuses.

2. An SOR exposure system according to claim 1, wherein the beam line to which the duplicating exposure apparatus is connected to said synchrotron radiation source is longer than other beam lines of said plurality of beam lines.

3. An SOR exposure system according to claim 1, further comprising:

X-ray intensity adjusting means, provided on the beam line to which said duplicating exposure apparatus is connected, for adjusting the intensity of the synchrotron radiation supplied to said duplicating exposure apparatus.

4. An SOR exposure system according to claim 1, wherein a wavelength of the synchrotron radiation supplied to said duplicating exposure apparatus is longer than a wavelength of the synchrotron radiation supplied to other exposure apparatuses of said plurality of exposure apparatuses.

5. An SOR exposure system according to claim 1, further comprising:

an illumination optical system including an X-ray mirror having a reflecting surface provided on each of said beam lines, the reflecting surface of said X-ray mirror provided on the beam line to which said duplicating exposure apparatus is connected having a greater surface roughness than that of other beam lines of said plurality of beam lines.

6. An SOR exposure system according to claim 1, further comprising:

an illumination optical system including an X-ray mirror provided on each of said beam lines, the illumination optical system on the beam line to which said duplicating exposure apparatus is connected exhibiting a large angle of incidence of a beam of the synchrotron radiation on the X-ray mirror as compared with the angle of incidence of beams of synchrotron radiation on the X-ray mirrors of other beam lines of said plurality of beam lines.

7. An SOR exposure apparatus according to claim 1, wherein said duplicating exposure apparatus includes a proximity gap between an original mask and a substrate to be exposed which is smaller than that in other exposure apparatuses of said plurality of exposure apparatuses.

8. An SOR exposure system comprising:

a synchrotron radiation source; and a plurality of X-ray exposure apparatuses, connected to said synchrotron radiation source by a plurality of beam lines, for manufacturing semiconductor devices, wherein one of said plurality of exposure apparatuses comprises a duplicating exposure apparatus for duplicating an original mask to form a duplicated mask by exposing the original mask and a substrate disposed proximate to each other with the synchrotron radiation to transfer a pattern of the original mask to the substrate to form the duplicated mask, and wherein an intensity of illumination radiation introduced into said duplicating exposure apparatus for duplicating the original mask is less than that introduced into the other exposure apparatuses.

9. An SOR exposure system according to claim 8, wherein the beam line to which the duplicating exposure apparatus is connected to said synchrotron radiation source is longer than other beam lines of said plurality of beam lines.

10. An SOR exposure system according to claim 8, further comprising:

X-ray intensity adjusting means, provided on the beam line to which said duplicating exposure apparatus is connected, for adjusting the intensity of the synchrotron radiation supplied to said duplicating exposure apparatus.

11. An SOR exposure system according to claim 8, wherein a wavelength of the synchrotron radiation supplied to said duplicating exposure apparatus is longer than a wavelength of the synchrotron radiation supplied to other exposure apparatuses of said plurality of exposure apparatuses.

12. An SOR exposure system according to claim 8, further comprising:

an illumination optical system including an X-ray mirror having a reflecting surface provided on each of said beam lines, the reflecting surface of said X-ray mirror provided on the beam line to which said duplicating exposure apparatus is connected having a greater surface roughness than that of other beam lines of said plurality of beam lines.

13. An SOR exposure system according to claim 8, further comprising:

an illumination optical system including an X-ray mirror provided on each of said beam lines, the illumination optical system on the beam line to which said duplicating exposure apparatus is connected exhibiting a large angle of incidence of a beam of the synchrotron radiation on the X-ray mirror as compared with the angle of incidence of beams of synchrotron radiation on the X-ray mirrors of other beam lines of said plurality of beam lines.

14. An SOR exposure apparatus according to claim 8, wherein said duplicating exposure apparatus includes a proximity gap between an original mask and a substrate to be exposed which is smaller than that in other exposure apparatuses of said plurality of exposure apparatuses.

* * * * *

UNITED STATES PATENT AND TRADEMARK OFFICE
CERTIFICATE OF CORRECTION

PATENT NO. : 5,623,529
DATED : April 22, 1997
INVENTOR(S) : Ryuichi EBINUMA, ET AL.

It is certified that error appears in the above-indentified patent and that said Letters Patent is hereby corrected as shown below:

COLUMN 8:

Line 20, "filter 15" should read --filter 115--.

Signed and Sealed this

Thirtieth Day of September, 1997

Attest:

BRUCE LEHMAN

Attesting Officer

Commissioner of Patents and Trademarks